US012787487B2

(12) United States Patent
Vakil et al.

(10) Patent No.: US 12,787,487 B2
(45) Date of Patent: Nov. 3, 2026

(54) PHOTONIC DEVICES WITH THERMAL ISOLATION

(71) Applicant: GlobalFoundries U.S. Inc., Malta, NY (US)

(72) Inventors: Apoorva Vakil, Clifton Park, NY (US); Romain Feuillette, Williston, VT (US); Ryan W. Sporer, Mechanicville, NY (US); Michal Rakowski, Ballston Lake, NY (US)

(73) Assignee: GlobalFoundries U.S. Inc., Malta, NY (US)

( * ) Notice: Subject to any disclaimer, the term of this patent is extended or adjusted under 35 U.S.C. 154(b) by 346 days.

(21) Appl. No.: 18/581,778

(22) Filed: Feb. 20, 2024

(65) Prior Publication Data

US 2025/0267980 A1 Aug. 21, 2025

(51) Int. Cl.
*H10F 77/60* (2025.01)
*H10F 77/14* (2025.01)
*H10F 77/40* (2025.01)

(52) U.S. Cl.
CPC ........... *H10F 77/60* (2025.01); *H10F 77/147* (2025.01); *H10F 77/413* (2025.01)

(58) Field of Classification Search
CPC ........................................................ H10F 77/60
See application file for complete search history.

(56) References Cited

U.S. PATENT DOCUMENTS 6,122,416 A * 9/2000 Ooba .................... G02F 1/3132 398/1
7,565,038 B2 * 7/2009 Earnshaw ............. G02F 1/0147 385/1
10,209,539 B1 * 2/2019 Doerr ....................... G02F 1/011
10,268,055 B1 * 4/2019 Doerr ..................... G02F 1/0147
10,393,960 B1 * 8/2019 Shank ..................... G02B 6/132
11,982,887 B2 * 5/2024 Buchbinder .......... G02F 1/0147
2004/0240818 A1 * 12/2004 Laskowski .............. G02F 1/011 385/16
2008/0181550 A1 * 7/2008 Earnshaw ............. G02F 1/0147 385/1
2017/0248805 A1 * 8/2017 Gill ......................... G02F 1/011
2018/0143462 A1 * 5/2018 Gill ........................ G02B 6/136
(Continued)

FOREIGN PATENT DOCUMENTS

EP 3400635 B1 6/2023

OTHER PUBLICATIONS

S. Pal et al., "Low Pπ-value Thermal Phase-Shifters in Si-Photonics Technology," 2022 IEEE International Conference on Emerging Electronics (ICEE), Bangalore, India, 2022, pp. 1-5, doi: 10.1109/ICEE56203.2022.10117901.
(Continued)

*Primary Examiner* — William A Harriston
(74) *Attorney, Agent, or Firm* — Thompson Hine LLP; Anthony Canale

(57) ABSTRACT

Structures including a photonic device with thermal isolation and related methods. The structure comprises a semiconductor substrate including a first cavity, a second cavity, and a wall between the first cavity and the second cavity. The structure further comprises a photonic device over the first cavity, the second cavity, and the wall, and a dielectric layer between the photonic device and the wall of the semiconductor substrate.

20 Claims, 8 Drawing Sheets

(56) References Cited

U.S. PATENT DOCUMENTS

| | | | | |
|---|---|---|---|---|
| 2019/0265406 | A1* | 8/2019 | Shank | G02B 6/122 |
| 2022/0113565 | A1* | 4/2022 | Buchbinder | G02F 1/0147 |

OTHER PUBLICATIONS

D. Coenen et al., "Thermal Modelling of Silicon Photonic Ring Modulator with Substrate Undercut," in Journal of Lightwave Technology, vol. 40, No. 13, pp. 4357-4363, 1 Jul. 1, 2022, doi: 10.1109/JLT.2022.3162987.

* cited by examiner

PHOTONIC DEVICES WITH THERMAL ISOLATION

BACKGROUND

The disclosure relates to photonic chips and, more specifically, to structures including a photonic device with thermal isolation and related methods.

Photonic chips are used in many applications and systems including, but not limited to, data communication systems and data computation systems. A photonic chip includes a photonic integrated circuit comprised of photonic devices, such as modulators, polarizers, and optical couplers, that are used to manipulate light received from a light source, such as a laser or an optical fiber.

A thermo-optic phase shifter is a photonic device that can be used in a photonic integrated circuit to modulate the phase of light propagating in a waveguide core. Heat is generated by a heater and transferred from the heater to a section of the waveguide core, which is comprised of a material having a refractive index that varies with temperature. The performance of a thermo-optic phase shifter may be contingent upon the efficient transport of heat from the heater to the waveguide core. The performance of a thermo-optic phase shifter may be negatively impacted by heat unwantedly transported from a heater associated with an adjacent thermo-optic phase shifter.

An undercut may be formed in the semiconductor substrate beneath the thermo-optic phase shifter with an objective of improving the heater efficiency. However, the undercut can trigger issues with mechanical stability of the semiconductor substrate beneath the thermo-optic phase shifter. In addition, the surface above the undercut may sink, which may adversely impact chemical-mechanical polishing and may also adversely impact the ability to land contacts for the heater.

Improved structures including a photonic device with thermal isolation and related methods are needed.

SUMMARY

In an embodiment of the invention, a structure comprises a semiconductor substrate including a first cavity, a second cavity, and a wall between the first cavity and the second cavity. The structure further comprises a photonic device over the first cavity, the second cavity, and the wall, and a dielectric layer between the photonic device and the wall of the semiconductor substrate.

In an embodiment of the invention, a method comprises forming a first cavity and a second cavity in a semiconductor substrate. The semiconductor substrate includes a wall between the first cavity and the second cavity. The method further comprises forming a photonic device over the first cavity, the second cavity, and the wall. A dielectric layer is disposed between the photonic device and the wall of the semiconductor substrate.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention. In the drawings, like reference numerals refer to like features in the various views.

DETAILED DESCRIPTION

Figure 1:
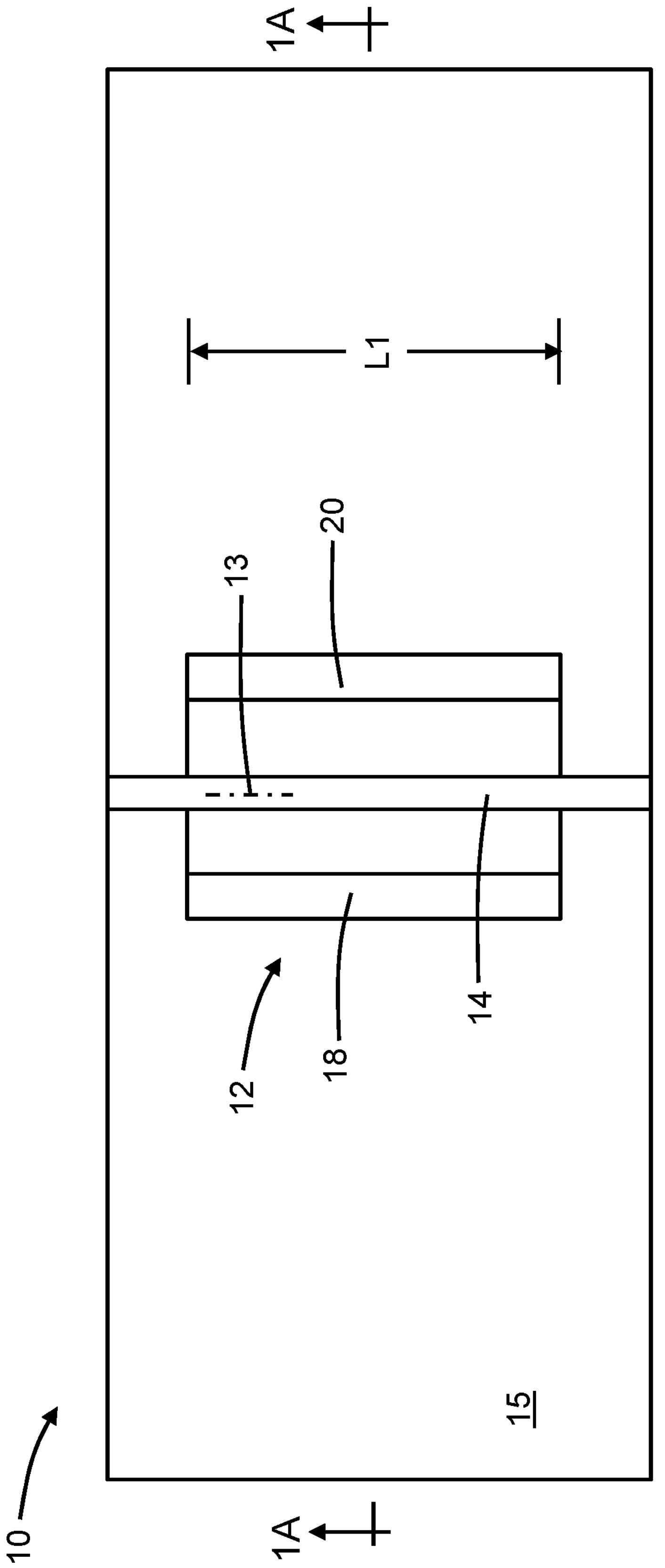
FIG. 1 is a top view of a structure at an initial fabrication stage of a processing method in accordance with embodiments of the invention.
Figure 1A:
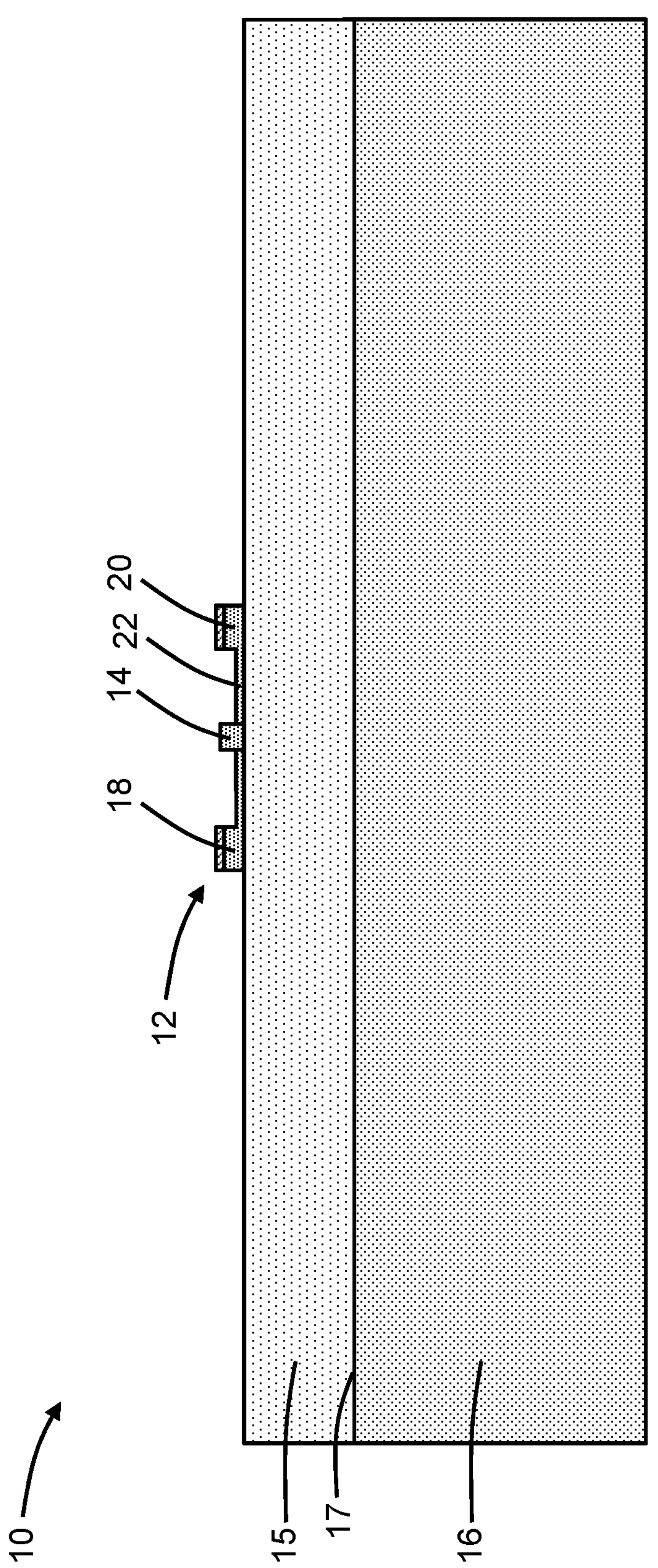
FIG. 1A is a cross-sectional view taken generally along line 1A-1A in FIG. 1.

With reference to FIGS. 1, 1A and in accordance with embodiments of the invention, a structure 10 for a photonic chip includes a thermo-optic phase shifter 12 and a waveguide core 14 that are disposed on, and over, a dielectric layer 15 and a semiconductor substrate 16 of a photonic chip. In an embodiment, the dielectric layer 15 may be comprised of a dielectric material, such as silicon dioxide, and the semiconductor substrate 16 may be comprised of a semiconductor material, such as single-crystal silicon. In an embodiment, the dielectric layer 15 may be a buried oxide layer of a silicon-on-insulator substrate. The semiconductor substrate 16 may adjoin the dielectric layer 15 along an interface 17, which represents a top surface of the semiconductor substrate 16 and a bottom surface of the dielectric layer 15.

The thermo-optic phase shifter 12 includes a resistive heating element 18, a resistive heating element 20, and a slab layer 22 that extends laterally as a strip from the resistive heating element 18 to a section of the waveguide core 14 and from the resistive heating element 20 to the section of the waveguide core 14. The section of the waveguide core 14 is disposed laterally between the resistive heating element 18 and the resistive heating element 20. In an embodiment, the section of the waveguide core 14 may be positioned equidistantly between the resistive heating element 18 and the resistive heating element 20. The slab layer 22 may have a thickness that is less than the thickness of the waveguide core 14. The slab layer 22 may physically connect the resistive heating element 18 to a lower portion of the section of the waveguide core 14 and the resistive heating element 20 to a lower portion of the section of the waveguide core 14 such that respective thermal conduction paths are defined. The section of the waveguide core 14 that is connected by the slab layer 22 to the resistive heating element 18 and the resistive heating element 20 may extend over a length L that is aligned parallel to a longitudinal axis 13 of the waveguide core 14.

In an embodiment, the waveguide core 14, resistive heating elements 18, 20, and slab layer 22 may be comprised of a semiconductor material, such as single-crystal silicon. In an embodiment, the waveguide core 14, resistive heating elements 18, 20, and slab layer 22 may be formed by patterning the semiconductor material (e.g., single-crystal silicon) of a device layer of a silicon-on-insulator substrate with multiple lithography and etching processes. In an embodiment, the resistive heating elements 18, 20 may be doped with either a p-type dopant or an n-type dopant. The resistive heating elements 18, 20 may be capped by a metal silicide, such as nickel silicide, formed by a silicidation process that consumes a portion of the semiconductor material of the resistive heating elements 18, 20.

In an alternative embodiment, the thermo-optic phase shifter 12 may be replaced by a different type of active photonic device. For example, the active photonic device may alternatively be a micro-ring modulator, a ring-based dense wavelength-division multiplexing device, or a Mach-Zehnder interferometer-based coarse wavelength division multiplexing device that includes one or more resistive heating elements 18, 20.

Figure 2:
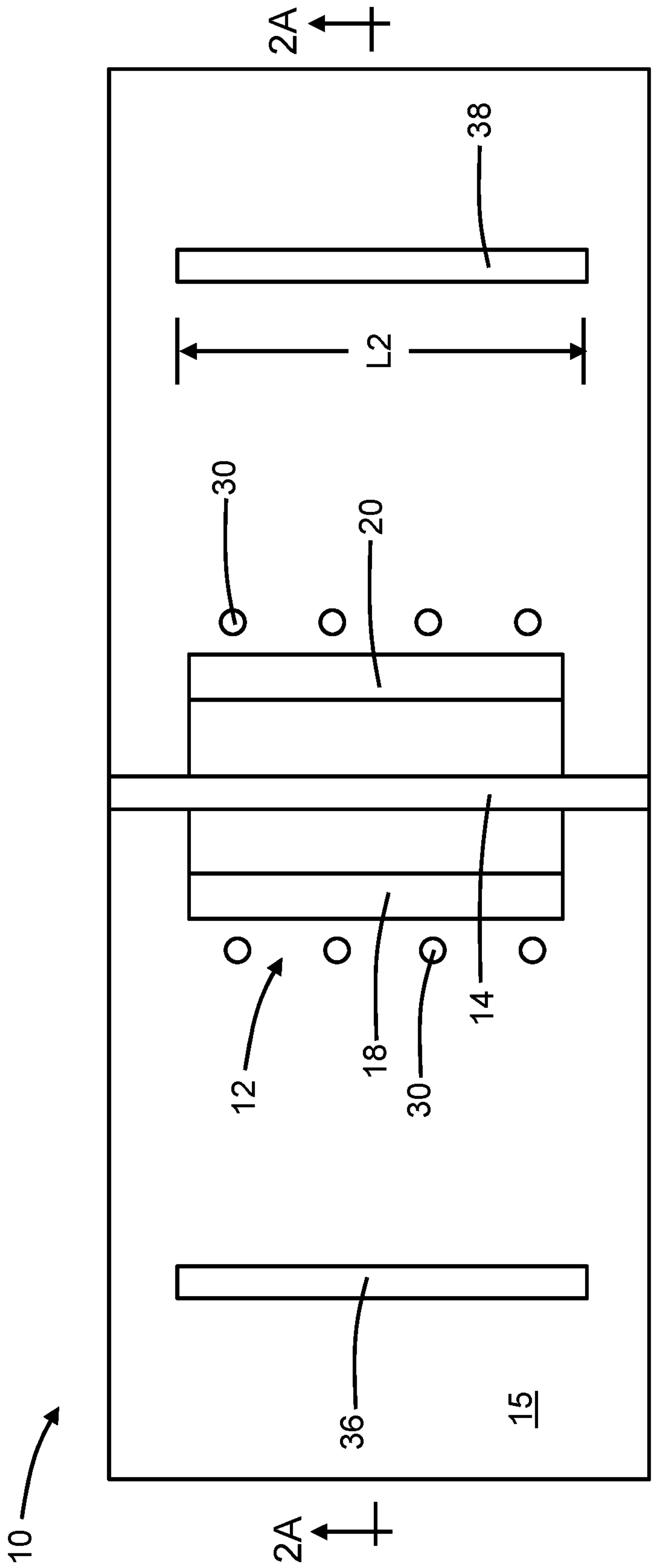
FIG. 2 is a top view of the structure at a fabrication stage of the processing method subsequent to FIGS. 1, 1A.
Figure 2A:
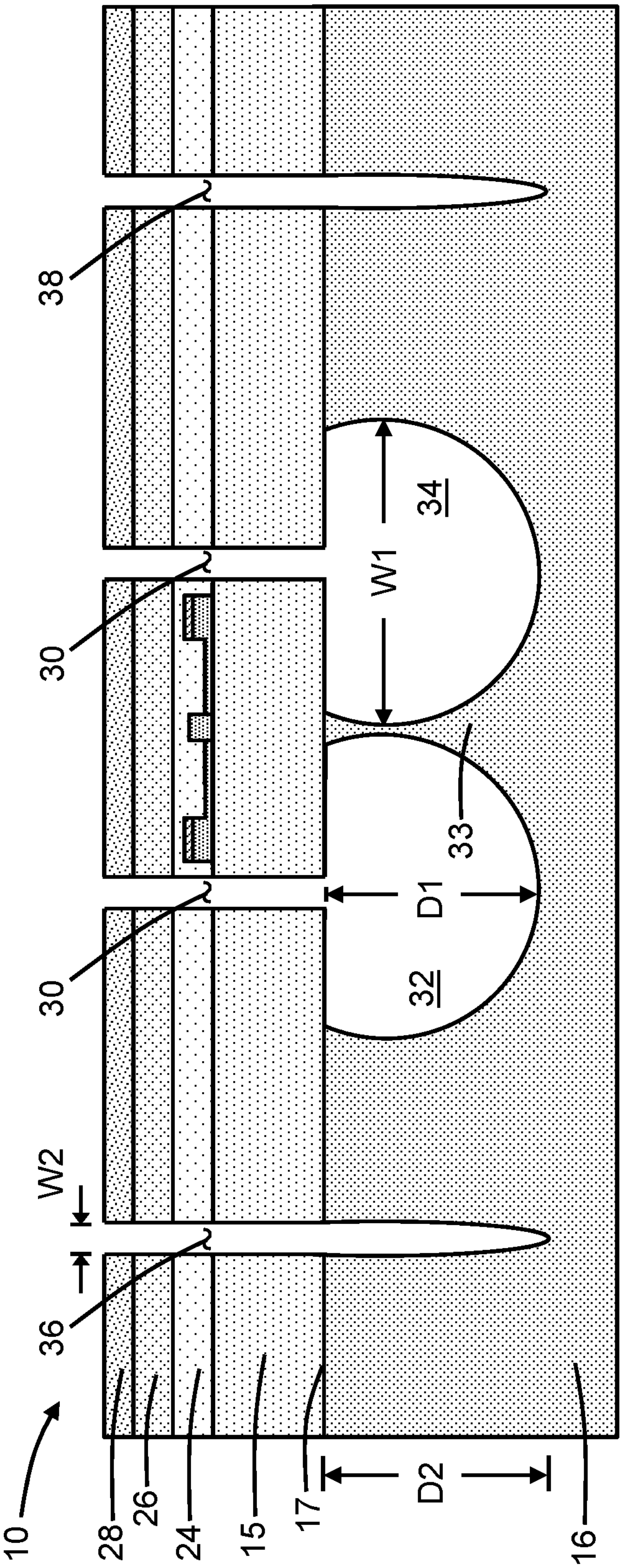
FIG. 2A is a cross-sectional view taken generally along line 2A-2A in FIG. 2.

With reference to FIGS. 2, 2A in which like reference numerals refer to like features in FIGS. 1, 1A and at a subsequent fabrication stage, dielectric layers 24, 26, 28 are formed on, and over, the thermo-optic phase shifter 12 and the waveguide core 14. The dielectric layer 24 may be comprised of a dielectric material, such as silicon dioxide, having a refractive index that is less than the refractive index of the material constituting the waveguide core 14, resistive heating element 18, resistive heating element 20, and slab layer 22. The thermo-optic phase shifter 12 and the waveguide core 14 may be embedded in the dielectric layer 24. The dielectric layer 26 may be comprised of a dielectric material, such as silicon nitride, different from the dielectric material of the dielectric layer 24. The dielectric layer 28 may be comprised of a dielectric material, such as undoped silicate glass, different from the dielectric material of the dielectric layer 26.

Pilot openings 30 may be formed that extend through the dielectric layers 24, 26, 28 and the dielectric layer 15 and then penetrate past the interface 17 into the semiconductor substrate 16. The pilot openings 30 may be formed by an anisotropic etching process. Cavities 32, 34 may be formed as undercuts in the semiconductor substrate 16 by an isotropic etching process that relies on the pilot openings 30 for ingress and egress of an etchant to remove the semiconductor substrate 16. The isotropic etching process includes a vertical etching component and a lateral etching component that results in each of the cavities 32, 34 being deepened to a maximum depth D1 relative to the interface 17 and being widened to a maximum width W1. In an embodiment, the cavities 32, 34 may have a length parallel to the longitudinal axis 13 that is less than or equal to the length L1 of the section of the waveguide core 14 that is connected by the slab layer 22 to the resistive heating elements 18, 20.

The cavities 32, 34 may be unmerged such that a partition or wall 33 including the semiconductor material of the semiconductor substrate 16 is laterally disposed between the cavity 32 and the cavity 34. The cavities 32, 34 define different portions of a partitioned undercut that is disposed beneath the thermo-optic phase shifter 12. The wall 33 separates the cavity 32 from the cavity 34 such that the cavities 32, 34 are partitioned and isolated from each other. The dielectric layer 15 is disposed between the wall 33 and the thermo-optic phase shifter 12.

The wall 33 may include a curvature at the boundaries with the cavities 32, 34, which arises from the multi-directional nature of the isotropic etching process, such that the thickness of the wall 33 varies with increasing distance from the interface 17. In an embodiment, the thickness of the wall 33 may initially decrease with increasing distance from the interface 17 and, at an inflection point, may begin to increase with increasing distance from the interface 17 such that the wall 33 initially thins and then subsequently thickens with increasing distance from the interface 17. In an embodiment, the thickest portion of the wall 33 may be located at the maximum depth D1 of the cavities 32, 34. In an embodiment, the section of the waveguide core 14 connected by the slab layer 22 to the resistive heating elements 18, 20 may overlap with the wall 33. In an embodiment, the wall 33 may be aligned with the section of the waveguide core 14 connected by the slab layer 22 to the resistive heating elements 18, 20. In an embodiment, the wall 33 may be laterally disposed equidistant from the different resistive heating elements 18, 20.

The wall 33 may function to improve the mechanical stability of the semiconductor substrate 16 beneath the thermo-optic phase shifter 12 in comparison with conventional merged cavities providing an undercut. In addition, the surface above the cavities 32, 34 may experience less sinking, which may reduce the adverse impact of the cavities 32, 34 on chemical-mechanical polishing and the adverse impact of the cavities 32, 34 upon landing contacts to the resistive heating elements 18, 20.

Trenches 36, 38 may be formed that extend through the dielectric layers 24, 26, 28 and the dielectric layer 15 and then penetrate past the interface 17 into the semiconductor substrate 16. In an embodiment, the trenches 36, 38 may be formed as open volumes by an anisotropic etching process. In an embodiment, each of the trenches 36, 38 may have a maximum depth D2 relative to the interface 17, a maximum width W2, and a length L2. The maximum width W1 of the cavities 32, 34 is greater than the maximum width W2 of the trenches 36, 38. In an embodiment, the maximum depth D2 of the trenches 36, 38 may be greater than the maximum depth D1 of the cavities 32, 34. In an alternative embodiment, the maximum depth D2 of the trenches 36, 38 may be less than or equal to the maximum depth D1 of the cavities 32, 34. In an embodiment, the length L2 of the trenches 36, 38 may be greater than the length L1 of the section of the waveguide core 14 that is connected by the slab layer 22 to the resistive heating elements 18, 20. In an alternative embodiment, the length L2 of the trenches 36, 38 may be less than or equal to the length L1 of the section of the waveguide core 14 that is connected by the slab layer 22 to the resistive heating elements 18, 20. The thermo-optic phase shifter 12 and the section of the waveguide core 14 connected by the slab layer 22 to the resistive heating elements 18, 20 is laterally disposed laterally between the trench 36 and the trench 38.

The trenches 36, 38 are non-intersecting with the cavities 32, 34, and the waveguide core 14 is non-overlapping with the trenches 36, 38. The trench 36 is laterally spaced from the cavity 32, and the trench 38 is laterally spaced from the cavity 34. Each of the trenches 36, 38 is laterally spaced from the thermo-optic phase shifter 12 and the waveguide core 14. In an embodiment, the trenches 36, 38 may be elongated in a direction parallel to the longitudinal axis 13 of the waveguide core 14. In an embodiment, the trenches 36, 38 may be aligned parallel to the longitudinal axis 13 of the waveguide core 14. In an alternative embodiment, the trenches 36, 38 may be angled relative to the longitudinal axis 13 of the waveguide core 14. In an embodiment, the trenches 36, 38 may be linearly aligned along a direction of the length L2. In an alternative embodiment, the trenches 36, 38 may have a non-linear (e.g., curved) shape along a direction of the length L2. In an alternative embodiment, the trenches 36, 38 may be formed by a combination of anisotropic and isotropic etching processes to provide a different shape for the open volumes in the semiconductor substrate 16. In an embodiment, the trenches 36, 38 may be formed separately from the pilot openings 30 and the cavities 32, 34.

Figure 3:
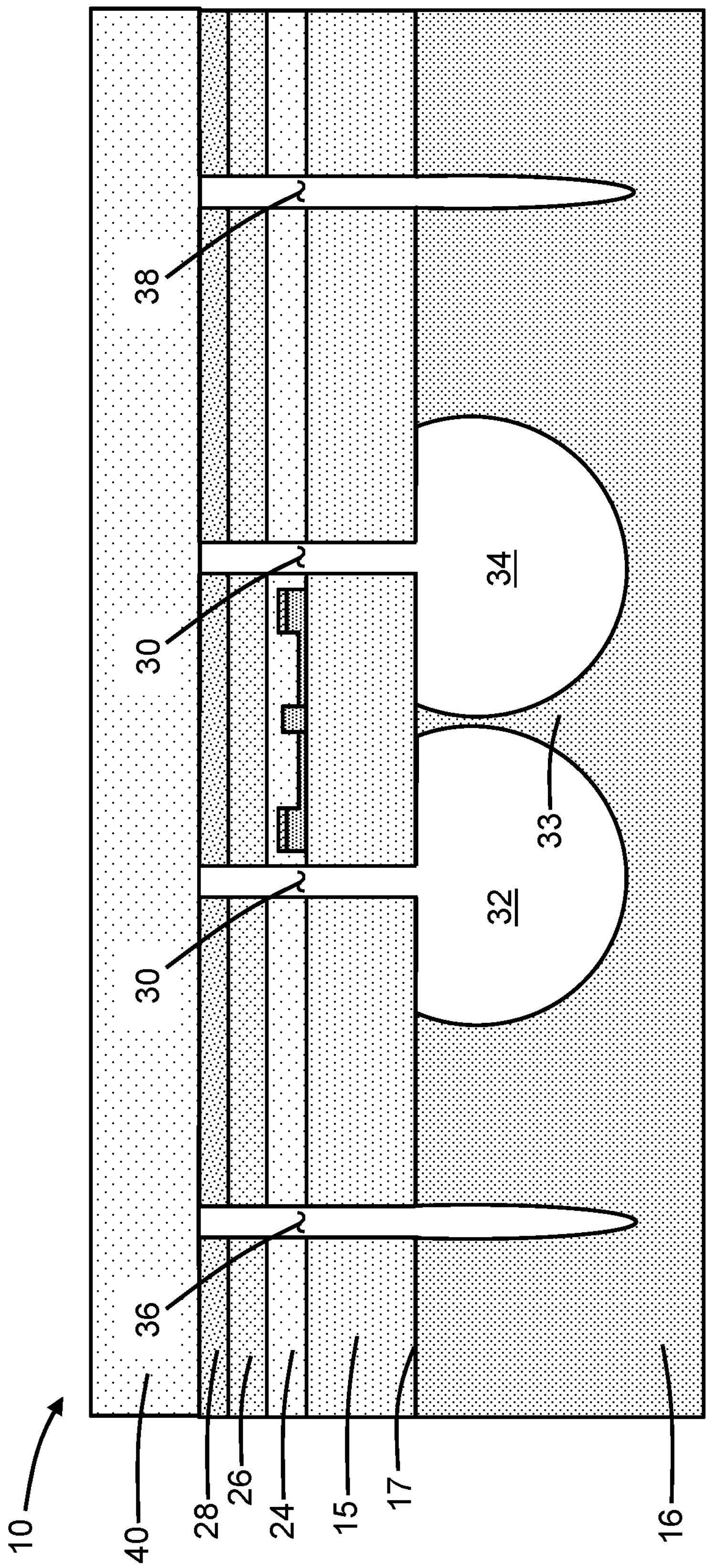
FIG. 3 is a cross-sectional view of the structure at a fabrication stage of the processing method subsequent to FIGS. 2, 2A.

With reference to FIG. 3 in which like reference numerals refer to like features in FIGS. 2, 2A and at a subsequent fabrication stage, a dielectric layer 40 may be formed on the dielectric layer 28. The dielectric layer 40 may be comprised of a dielectric material, such as silicon dioxide. The dielectric layer 40 covers and seals the entrances to the trenches 36, 38 and the entrances to the pilot openings 30.

The cavities 32, 34 represent closed airgaps that are capped by the dielectric layer 40, and the trenches 36, 38 represent distinct closed airgaps that are capped by the dielectric layer 40. The airgaps may contain atmospheric air at or near atmospheric pressure, may contain another gas at or near atmospheric pressure, or may contain atmospheric air or another gas at a sub-atmospheric pressure (e.g., a partial vacuum). The airgaps represented by the cavities 32, 34 and the airgaps represented by the trenches 36, 38 may be characterized by a permittivity or dielectric constant of near unity (i.e., vacuum permittivity), which is less than the dielectric constant of a solid dielectric material.

The resistive heating elements 18, 20 may be physically and electrically coupled by contacts (not shown) to a power source. The power source may be operated to supply a current that causes Joule heating of the resistive heating elements 18, 20 such that heat is transferred from the resistive heating elements 18, 20 to the section of the waveguide core 14 that is connected by the slab layer 22 to the resistive heating elements 18, 20. Heat generated by the resistive heating elements 18, 20 is transferred to the section of the waveguide core 14 through thermal paths provided by the slab layer 22. The temperature of the section of the waveguide core 14 that is connected by the slab layer 22 to the resistive heating elements 18, 20 is elevated by the transferred heat, which may be effective to change the refractive index of the material of the waveguide core 14 through the thermo-optic effect and to thereby alter the phase of propagating light.

The trench 36 may be laterally disposed between the thermo-optic phase shifter 12 and an adjacent thermo-optic phase shifter like the thermo-optic phase shifter 12. Similarly, the trench 38 may be laterally disposed between the thermo-optic phase shifter 12 and an adjacent thermo-optic phase shifter like the thermo-optic phase shifter 12. The trenches 36, 38 may improve thermal isolation between the thermo-optic phase shifter 12 and the adjacent thermo-optic phase shifters. The trenches 36, 38 may also enable fine tuning of the operation of the thermo-optic phase shifter 12 and the operation of the adjacent thermo-optic phase shifters. A benefit of the thermal isolation and the fine tuning is that the spacing between the thermo-optic phase shifter 12 and the adjacent thermo-optic phase shifters may be reduced due to a reduction in thermal crosstalk provided by the airgaps represented by the trenches 36, 38. The airgaps represented by the cavities 32, 34 may also improve the efficiency of the thermo-optic phase shifter 12.

Figure 4:
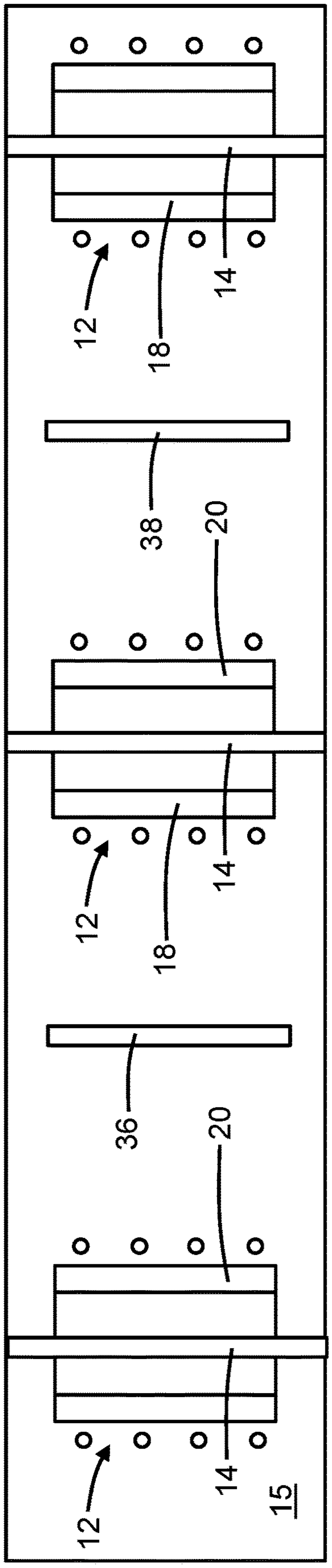
FIG. 4 is a top view of a structure in accordance with alternative embodiments of the invention.

With reference to FIG. 4 and in accordance with alternative embodiments, multiple instances of the thermo-optic phase shifter 12 and waveguide core 14 may be disposed on the dielectric layer 15 and semiconductor substrate 16. The trench 36 may be laterally disposed between adjacent instances of the thermo-optic phase shifter 12, and the trench 38 may also be disposed between adjacent instances of the thermo-optic phase shifter 12. More specifically, the trench 36 may be laterally disposed between the resistive heating element 18 of the central instance of the thermo-optic phase shifter 12 and the resistive heating element 20 of the adjacent instance of the thermo-optic phase shifter 12, and the trench 38 may be laterally disposed between the resistive heating element 20 of the central instance of the thermo-optic phase shifter 12 and the resistive heating element 18 of the adjacent instance of the thermo-optic phase shifter 12.

Figure 5:
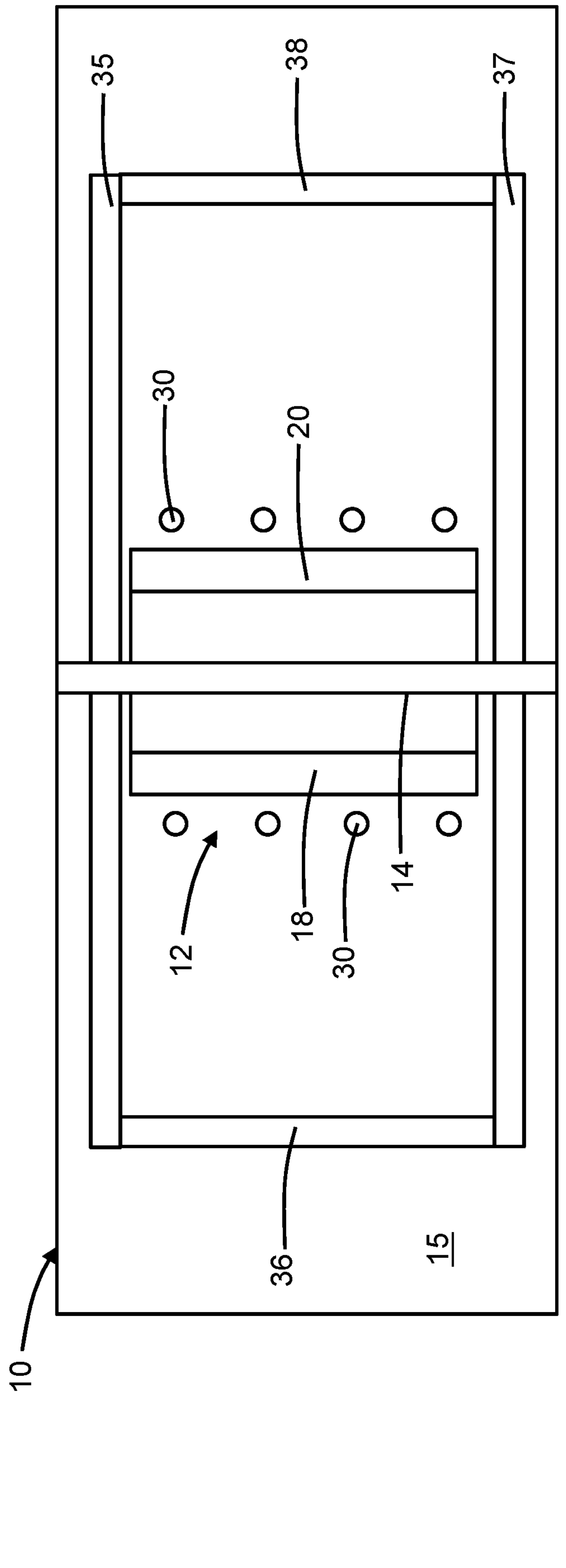
FIG. 5 is a top view of a structure in accordance with alternative embodiments of the invention.

With reference to FIG. 5 and in accordance with alternative embodiments, the structure 10 may further include a trench 35 and a trench 37 that extend through the dielectric layers 24, 26, 28 and the dielectric layer 15 and then penetrate past the interface 17 into the semiconductor substrate 16. The trenches 35, 37, which may be similar or identical to the trenches 36, 38, may also be capped by the dielectric layer 40 to form respective airgaps. In an embodiment, the trenches 35, 37 may connect the trench 36 to the trench 38 to define a set of airgaps that surround the thermo-optic phase shifter 12. In an embodiment, the trenches 35, 37 may extend beneath the waveguide core 14 to define a set of airgaps that fully surround the thermo-optic phase shifter 12. In an alternative embodiment, the trench 35 and the trench 37 may have a discontinuity at the location of the waveguide core 14.

Figure 6:
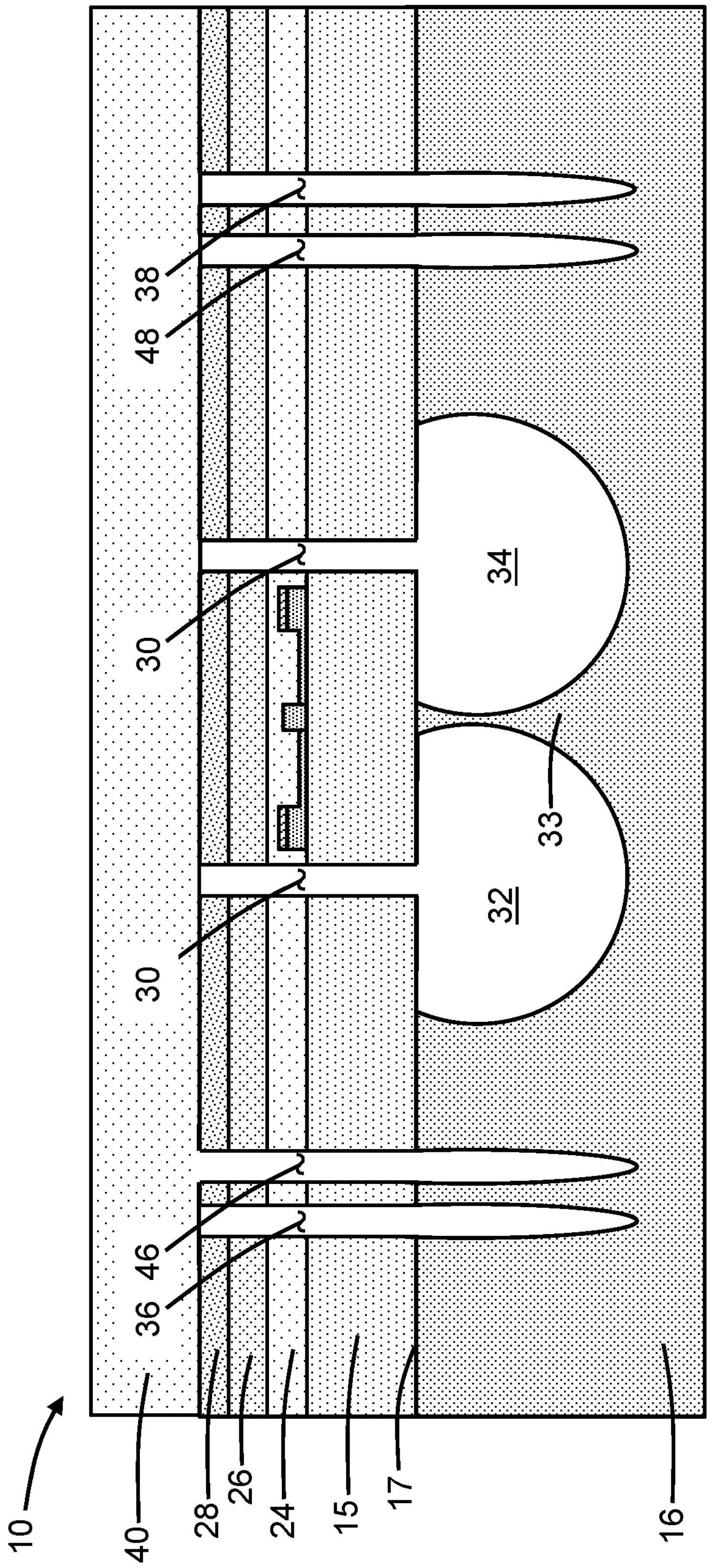
FIG. 6 is a cross-sectional view of a structure in accordance with alternative embodiments of the invention.

With reference to FIG. 6 and in accordance with alternative embodiments, an additional trench 46 may be disposed in the semiconductor substrate 16 adjacent to the trench 36, and an additional trench 48 may be disposed in the semiconductor substrate 16 adjacent to the trench 38. The trenches 46, 48, which may be similar or identical to the trenches 36, 38, extend through the dielectric layers 24, 26, 28 and dielectric layer 15 and then penetrate past the interface 17 into the semiconductor substrate 16. In an embodiment, each of the trenches 46, 48 may have the same maximum depth D2 relative to the interface 17 as the trenches 36, 38, the same maximum width W2 as the trenches 36, 38, and the same length L2 as the trenches 36, 38. In an embodiment, the trench 46 may be disposed between the trench 36 and the thermo-optic phase shifter 12, and the trench 48 may be disposed between the trench 38 and the thermo-optic phase shifter 12. The trenches 46, 48 may also be capped by the dielectric layer 40 to form respective airgaps.

The addition of the trenches 46, 48 may strengthen the thermal isolation provided by the trenches 36, 38 alone, especially for photonic devices having a high thermal sensitivity. In alternative embodiments, one or more additional trenches may be formed adjacent to the trenches 36, 46 and one or more additional trenches may be formed adjacent to the trenches 38, 48 to further increase the thermal isolation.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. The chip may be integrated with other chips, discrete circuit elements, and/or other signal processing devices as part of either an intermediate product or an end product. The end product can be any product that includes integrated circuit chips, such as computer products having a central processor or smartphones.

References herein to terms modified by language of approximation, such as “about”, “approximately”, and “substantially”, are not to be limited to the precise value specified. The language of approximation may correspond to the precision of an instrument used to measure the value and, unless otherwise dependent on the precision of the instrument, may indicate a range of +/−10% of the stated value(s).

References herein to terms such as “vertical”, “horizontal”, etc. are made by way of example, and not by way of limitation, to establish a frame of reference. The term “horizontal” as used herein is defined as a plane parallel to a conventional plane of a semiconductor substrate, regardless of its actual three-dimensional spatial orientation. The terms "vertical" and "normal" refer to a direction in the frame of reference perpendicular to the horizontal, as just defined. The term "lateral" refers to a direction in the frame of reference within the horizontal plane.

A feature "connected" or "coupled" to or with another feature may be directly connected or coupled to or with the other feature or, instead, one or more intervening features may be present. A feature may be "directly connected" or "directly coupled" to or with another feature if intervening features are absent. A feature may be "indirectly connected" or "indirectly coupled" to or with another feature if at least one intervening feature is present. A feature "on" or "contacting" another feature may be directly on or in direct contact with the other feature or, instead, one or more intervening features may be present. A feature may be "directly on" or in "direct contact" with another feature if intervening features are absent. A feature may be "indirectly on" or in "indirect contact" with another feature if at least one intervening feature is present. Different features "overlap" if a feature extends over, and covers a part of, another feature.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure comprising:

a semiconductor substrate including a first cavity, a second cavity, a first airgap, and a wall between the first cavity and the second cavity;

a first photonic device over the first cavity, the second cavity, and the wall, the first photonic device including a first waveguide core and a first resistive heating element adjacent to the first waveguide core, and the first resistive heating element disposed between the first airgap and the first waveguide core; and a dielectric layer between the first photonic device and the wall of the semiconductor substrate.

2. The structure of claim 1 wherein the first cavity is laterally disposed between the first airgap and the wall.

3. The structure of claim 1 wherein the first waveguide core of the first photonic device is laterally disposed over the first cavity and the second cavity.

4. The structure of claim 1 wherein the first resistive heating element of the first photonic device is disposed over the first cavity and the second cavity.

5. The structure of claim 1 wherein the semiconductor substrate includes a second airgap, and the first resistive heating element and the first waveguide core are laterally disposed between the first airgap and the second airgap.

6. The structure of claim 1 wherein the first airgap comprises a first trench in the semiconductor substrate.

7. The structure of claim 6 wherein the first trench has a first maximum width, and the first cavity has a second maximum width that is greater than the first maximum width.

8. The structure of claim 6 wherein the first waveguide core has a longitudinal axis, and the first trench is elongated in a direction of the longitudinal axis.

9. The structure of claim 6 wherein the first trench has a first maximum depth, and the first cavity has a second maximum depth that is less than the first maximum depth.

10. The structure of claim 9 wherein the first trench has a first maximum width, and the first cavity has a second maximum width that is greater than the first maximum width.

11. The structure of claim 6 wherein the first trench is laterally spaced from the first cavity.

12. The structure of claim 1 further comprising:

a second photonic device, wherein the first airgap is laterally disposed between the first photonic device and the second photonic device.

13. The structure of claim 12 wherein the second photonic device includes a second waveguide core and a second resistive heating element adjacent to the second waveguide core, and the first airgap is disposed between the first resistive heating element and the second resistive heating element.

14. The structure of claim 12 wherein the semiconductor substrate includes a second airgap, and the second airgap is laterally disposed between the first photonic device and the second photonic device.

15. The structure of claim 14 wherein the first airgap comprises a first trench in the semiconductor substrate, and the second airgap comprises a second trench in the semiconductor substrate.

16. The structure of claim 1 further comprising:

a second waveguide core, wherein the first airgap is disposed between the first resistive heating element and the second waveguide core.

17. The structure of claim 1 wherein the first airgap includes a portion in the dielectric layer.

18. The structure of claim 1 wherein the first waveguide core is aligned with the wall.

19. A method comprising:

forming a first cavity and a second cavity in a semiconductor substrate, wherein the semiconductor substrate includes a wall between the first cavity and the second cavity;

forming an airgap in the semiconductor substrate; and forming a photonic device over the first cavity, the second cavity, and the wall, wherein a dielectric layer is disposed between the photonic device and the wall of the semiconductor substrate, the photonic device includes a waveguide core and a resistive heating element adjacent to the waveguide core, and the resistive heating element is disposed between the airgap and the waveguide core.

20. The structure of claim 1 wherein the first waveguide core overlaps with the wall.

* * * * *